(12) United States Patent
Suzuki et al.

(10) Patent No.: US 6,944,431 B2
(45) Date of Patent: Sep. 13, 2005

(54) HIGH-FREQUENCY SIGNAL TRANSMISSION APPARATUS AND ELECTRONIC TUNER USING THE SAME

(75) Inventors: Masanori Suzuki, Aichi (JP); Atsuhito Terao, Gifu (JP); Sanae Asayama, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 446 days.

(21) Appl. No.: 10/347,080

(22) Filed: Jan. 17, 2003

(65) Prior Publication Data

US 2003/0157906 A1 Aug. 21, 2003

(30) Foreign Application Priority Data

Jan. 31, 2002 (JP) .................................. 2002-023027

(51) Int. Cl.[7] .............................. H04B 1/18; H04B 1/26
(52) U.S. Cl. ................... 455/188.2; 455/323; 455/326; 348/729; 725/79
(58) Field of Search .................. 455/179.1, 180.1, 455/180.2, 188.1, 188.2, 189.1, 190.1, 313, 323, 326, 327, 334, 3.01, 16, 20, 107, 127.1, 127.5; 348/706, 722, 725, 729, 731, 738; 725/79, 81, 149

(56) References Cited

U.S. PATENT DOCUMENTS

| | | | | |
|---|---|---|---|---|
| 3,939,429 A | | 2/1976 | Löhn et al. | |
| 4,276,655 A | * | 6/1981 | Kraemer et al. | ............. 455/327 |
| 4,525,738 A | * | 6/1985 | Imazeki et al. | ............. 348/706 |
| 4,912,553 A | * | 3/1990 | Pal et al. | ...................... 725/79 |
| 5,311,149 A | | 5/1994 | Wagner et al. | |
| 5,564,098 A | | 10/1996 | Rodal et al. | |
| 5,774,789 A | * | 6/1998 | van der Kaay et al. | ........ 455/16 |
| 6,795,128 B2 | * | 9/2004 | Yamamoto | ................... 348/729 |

FOREIGN PATENT DOCUMENTS

| | | |
|---|---|---|
| EP | 0 751 616 A1 | 1/1997 |
| EP | 1 024 590 A1 | 8/2000 |

* cited by examiner

*Primary Examiner*—Quochien B. Vuong
(74) *Attorney, Agent, or Firm*—RatnerPrestia

(57) ABSTRACT

An electronic tuner has an input terminal, a mixer receiving the signal fed into the input terminal, a matching circuit connected to an output of the mixer, a band-pass filter connected to an output of this matching circuit, an intermediate-frequency (IF) amplifier connected to an output of the band-pass filter, and an output terminal receiving output of the IF amplifier. These circuits are composed of balanced circuits and connected by balanced lines. The mixer has a high output impedance. For the matching circuit, the impedance of the matching circuit at the band-pass filter side is equal to the impedance of the band-pass filter at the matching circuit side. This structure can realize an electronic tuner having low power consumption.

15 Claims, 2 Drawing Sheets

HIGH-FREQUENCY SIGNAL TRANSMISSION APPARATUS AND ELECTRONIC TUNER USING THE SAME

FIELD OF THE INVENTION

The present invention relates to a high-frequency signal transmission apparatus and an electronic tuner using the same.

BACKGROUND OF THE INVENTION

A conventional electronic tuner is described hereinafter with reference to FIG. 4, as an example of a conventional high-frequency signal transmission apparatus.

FIG. 4 shows a conventional electronic tuner. In the drawing, high-frequency (HF) signals that have been modulated by television signals are fed into low-noise HF amplifier 102, via input terminal 101. Fed into mixer 105 are the output of HF amplifier 102 and the output of local oscillator 104. The output of this mixer 105 is fed into band-pass filter 106. In turn, the output of band-pass filter 106 is fed into intermediate-frequency (IF) amplifier 107. The output of this IF amplifier 107 and the output of local oscillator 108 are fed into mixer 109. In turn, the output of this mixer 109 is fed into band-pass filter 110. IF amplifier 111 amplifies the output of band-pass filter 110. The output signals from IF amplifier 111 are supplied via output terminal 112. The conventional electronic tuner is structured as above.

All these components are connected to provide a low impedance of approx. 50 Ω and made of unbalanced circuits. However, there is a problem. Because the HF signal transmission apparatus for use in such a conventional electronic tuner is made of components having a low impedance of 50 Ω, a large current flowing therethrough causes large power consumption. Further, because all the components are made of unbalanced circuits, an amplitude that a single active element can handle is small. Therefore, a plurality of amplifiers are required to amplify the signals to a large degree. This results in a problem of large power consumption.

SUMMARY OF THE INVENTION

A high-frequency (HF) signal transmission apparatus includes:
  an input terminal;
  a first active electric circuit receiving a signal fed into the input terminal;
  a matching circuit connected to an output of the first active electric circuit;
  a band-pass filter connected to an output of the matching circuit;
  a second active electric circuit connected to an output of the band-pass filter; and
  an output terminal receiving output of the second active electric circuit.

The first active electric circuit, the matching circuit, the band-pass filter, and the second active electric circuit are composed of balanced circuits and connected by a balanced line.

The first active electric circuit has a high output impedance.

For the matching circuit, the impedance of the matching circuit on the band-pass filter side is equal to the impedance of the band-pass filter on the matching circuit side.

An electronic tuner includes:
  an input terminal receiving a high-frequency (HF) signal;
  a local oscillator;
  a mixer receiving the HF signal fed into the input terminal and output of the local oscillator;
  a matching circuit connected to an output of the mixer;
  a band-pass filter connected to an output of the matching circuit;
  an intermediate-frequency (IF) amplifier connected to an output of the band-pass filter; and
  an output terminal receiving output of the IF amplifier.

At least the mixer, the matching circuit, the band-pass filter, and the IF amplifier are composed of balanced circuits and connected by a balanced line.

The mixer has a high output impedance.

For the matching circuit, the impedance of the matching circuit on the band-pass filter side is equal to the impedance of the band-pass filter on the matching circuit side.

DETAILED DESCRIPTION OF THE EXEMPLARY EMBODIMENTS

Figure 1:
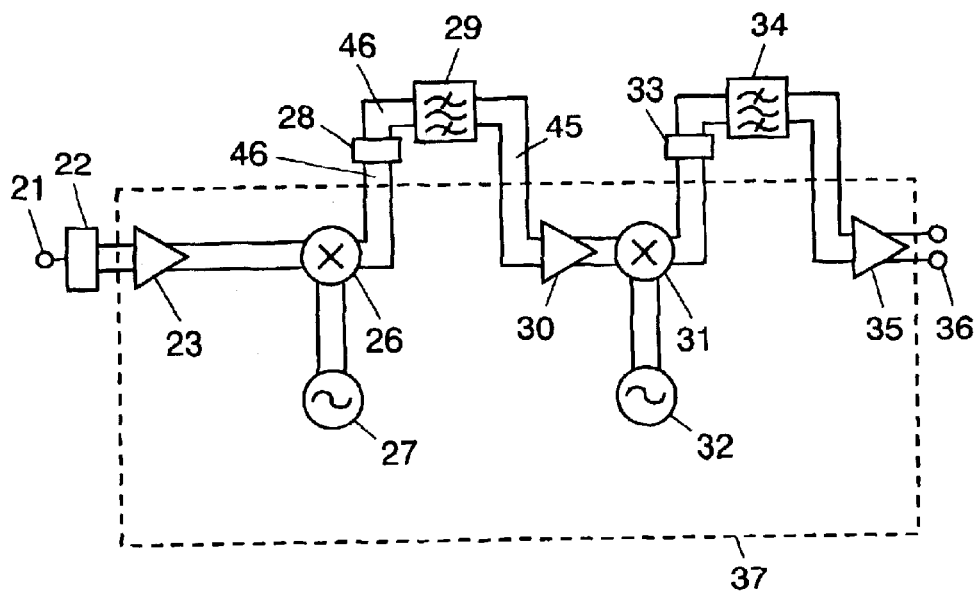
FIG. 1 is a block diagram of an electronic tuner in accordance with an exemplary embodiment of the present invention.

An exemplary embodiment of the present invention is demonstrated hereinafter with reference to the accompanying drawings. FIG. 1 is a block diagram of an electronic tuner in accordance with the exemplary embodiment of the present invention. This is an example of an electronic tuner using a high-frequency (HF) signal transmission apparatus in accordance with the present invention.

With reference to FIG. 1, HF signals modulated by television signals are supplied into input terminal 21. These HF signals include signals that are transmitted through a plurality of television broadcast channels and have different frequencies. The frequencies of the television broadcast channels of these HF signals to be received range from approx. 50 to 900 MHz. Connected to this input terminal 21 is unbalanced-to-balanced converter 22. This unbalanced-to-balanced converter 22 converts a signal that is unbalanced and has an impedance of 75 Ω into a signal that is balanced and has a impedance of 75 Ω. Converting the input impedance into an impedance of an integral multiple thereof simplifies the structure of unbalanced-to-balanced converter 22.

The output of unbalanced-to-balanced converter 22 is fed into the inside of integrated circuit 37 surrounded by dotted lines, and connected to low-noise HF amplifier 23. The output of this low-noise HF amplifier 23 is connected to one input of first mixer 26. Connected to the other input of this first mixer 26 is the output of first local oscillator 27. Utilizing the output of first local oscillator 27, first mixer 26 converts the output signals from HF amplifier 23 to first intermediate-frequency (IF) signals. The center frequency of the first IF signals is 1,890 MHz. This frequency of 1,890

MHz is set to a value at least twice as high as the maximum frequency of the HF signals to be received and fed into input terminal 21, i.e. 900 MHz. Setting the frequencies of the first IF signals at least twice in this manner allows reduction in third-harmonics distortion of the signals to be received. It also ensures elimination of image interference. First mixer 26 is an example of first active electric circuits.

The output part of first mixer 26 has an open-collector structure. The output of first mixer 26 is connected to first matching circuit 28 provided outside of integrated circuit 37. The output of this first matching circuit 28 is connected to first band-pass filter 29 having an input impedance of 200 Ω. The output of first band-pass filter 29 is connected to first IF amplifier 30 inside of integrated circuit 37. In turn, the output of this first IF amplifier 30 is connected to one input of second mixer 31. Connected to the other input thereof is the output of second local oscillator 32. Utilizing the output of second local oscillator 32, this second mixer 31 converts the output signals from first IF amplifier 30 to second IF signals. The center frequency of the second IF signals is 44 MHz.

Converting into such a frequency facilitates the process in the next stage. First IF amplifier 30 is an example of second active electric circuits. Second mixer 31 is an example of first active electric circuits.

The output part of second mixer 31 has an open-collector structure. The output of second mixer 31 is connected to second matching circuit 33 provided outside of integrated circuit 37. The output of this second matching circuit 33 is connected to second band-pass filter 34 having an input impedance of 200 Ω. The output of second band-pass filter 34 is connected to second IF amplifier 35 inside of integrated circuit 37. In turn, the output of this second IF amplifier 35 is connected to output terminal 36 of integrated circuit 37. Second IF amplifier 35 is an example of second active electric circuits. Used for first band-pass filter 29 and second band-pass filter 34 are surface acoustic wave (SAW) filters.

As described above, each of the output parts of first mixer 26 and second mixer 31 has an open-collector structure. Further, each of first band-pass filter 29 and second band-pass filter 34 has a input impedance of 200 Ω. Because this input impedance is higher than that of those in a conventional electronic tuner, i.e. 50 Ω, a smaller current flows through the tuner of this invention. Thus, an electronic tuner having low power consumption can be realized.

Because theses components are connected to provide a high impedance of approx. 200 Ω, an electronic tuner having low power consumption can be realized. Additionally, because balanced circuits are used for these components, a single active electric element can handle signals having large amplitudes. Thus, the circuits forming the amplifiers can be scaled down. This also contributes to further reduction in power consumption of the electronic tuner. The use of balanced circuits also allows elimination of influence of externally supplied noise.

Because the electronic tuner of this embodiment is structured as a double superheterodyne type, it can easily eliminate image interference. Although this embodiment is an electronic tuner of the double superheterodyne type, the present invention can be implemented with an electronic tuner of the single superheterodyne type.

In this embodiment, the output part of second mixer 31 has an open-collector structure. Instead, the output impedance of this second mixer 31 can be set to 50 Ω and second band-pass filter 34 that can be driven by an input impedance of 50 Ω can be used. In this case, second matching circuit 33 for matching the impedances of second mixer 31 and second band-pass filter 34 can be eliminated.

It is desirable to set the pass bandwidth of first band-pass filter 29 to a value substantially five times as large as the bandwidth of one of television broadcast channels through which HF signals are fed into input terminal 21. Used in this embodiment is first band-pass filter 29 having pass bandwidth ranging from 25 to 30 MHz. In general, at a higher center frequency of the band-pass filter, variations in the pass band frequency thereof increase. Setting an excessively larger pass bandwidth in order to prevent this adverse effect will produce another adverse effect of image signal interference occurring in frequency conversion at the next stage. In order to prevent the adverse effect caused by fluctuations of the characteristics of first band-pass filter 29 resulting from changes in ambient temperature, or variations in the component, the pass bandwidth of first band-pass filter 29 is set as above.

Signals filtered by second band-pass filter 34 are detected by a detector provided in the next stage (not shown) and restored to video signals or audio signals in a state of a baseband. In order to prevent mixture of undesirable components in this detection stage, it is desirable to set the pass bandwidth of second band-pass filter 34 to a value substantially equal to the bandwidth of one of television broadcast channels. For this reason, in the embodiment of the present invention, second band-pass filter 34 having a pass bandwidth ranging 6 to 8 MHz is used.

In this embodiment, the center frequency of the pass bandwidth of this second band-pass filter 34 is set to 44 MHz. This value is extremely lower than the center frequency of the pass bandwidth of first band-pass filter 29. This can considerably reduce variations in the pass band frequency caused by temperature change and variations in the component. As a result, the accuracy of the pass bandwidth and the absolute frequency of the pass band can be maintained. Because the accurate pass band frequencies are ensured against temperature change and variations in the component in this manner, passage of interfering signals can mainly be inhibited.

Figure 2:
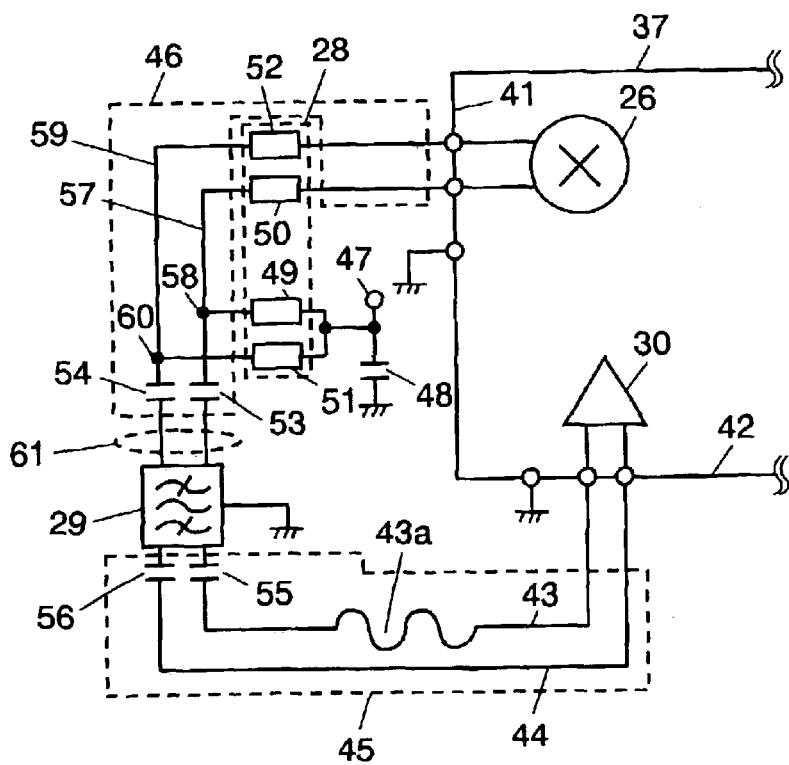
FIG. 2 is a circuit diagram showing a matching circuit and the vicinity thereof in the electronic tuner in accordance with the exemplary embodiment of the present invention.

Next, a description is provided of a matching circuit and the vicinity thereof referring to FIG. 2. Among first matching circuit 28 and second matching circuit 33, first matching circuit 28 is described by way of an example. First matching circuit 28 is disposed between first band-pass filter 29 and first mixer 26, and connected thereto. First mixer 26 is provided in the vicinity of side 41 of integrated circuit 37. First IF amplifier 30 is provided in the vicinity of side 42 adjacent to side 41. First matching circuit 28 is made of chip inductors 49 through 52.

First, a description is made of balanced line 45 for connecting the output of first band-pass filter 29 and first IF amplifier 30. Balanced line 45 is made of two lines in which the outer line is longer than the inner line. In order to make impedances of the two lines equal under such circumstances where there is a difference in lengths, inner line 43 is bent as portion 43a to have an impedance equal to that of outer line 44. Alternatively, outer line 44 is made thicker than inner line 43 to balance the impedance of the balanced line. Either method can be performed using etching technology in the production of the printed circuit board; thus, a thinner component can be produced at a lower cost.

Because first band-pass filter 29 has an output impedance of 200 Ω, the input impedance of first IF amplifier 30 is also set to 200 Ω. The input impedance of first IF amplifier 30 is realized by the bias resistors of transistors forming first IF amplifier 30.

Next, a description is provided of balanced line 46 connecting to first mixer 26. This balanced line 46 is connected to first matching circuit 28. Power is supplied to power terminal 47. Undesirable AC signals are grounded via capacitor 48. This power terminal 47 is connected to the collector of one of the transistors in first mixer 26 via chip inductors 49 and 50 connected in series. In this way, the power is supplied to the collector of this transistor.

In like manner, power terminal 47 is connected to the collector of the other transistor in first mixer 26 via chip inductors 51 and 52 connected in series. In this way, the power is supplied to the collector of this transistor. Capacitors 53 through 56 are inserted to block direct current.

Because these chip components are reflow-soldered, the self-alignment effect allows the chip components to be fixed into predetermined positions. Thus, the inductance value of the pattern will not be changed before and after the reflow soldering during production. As a result, stable performance can be obtained.

In mounting first matching circuit 28, and chip inductors 49 and 51, it should be noted that the length from node 58, i.e. intersection of chip inductor 49 and inner line 57 of balanced line 46, to the input of first band-pass filter 29 is equal to the length from node 60, i.e. intersection of chip inductor 51 and outer line 59 of balanced line 46, to the input of first band-pass filter 29. It is necessary to equalize the impedances of two lines and keep these two lines balanced in this way. When it is impossible to equalize the lengths of two lines, they can have different thicknesses so as to provide an equal impedance. The difference in impedances between inner line 57 and outer line 59 of balanced line 46 can also be compensated by making the values of chip inductors 50 and 52 different.

In this embodiment, chip inductors 49 through 52 are used as inductors for first matching circuit 28. These inductors can be formed as a pattern on the printed circuit board. Inductors can be formed by etching technology in such a pattern inductor; thus, a thinner component can be produced at a lower cost.

Power supply to the open collectors of the transistors in the output part of first mixer 26 is performed, using chip inductors 49, 50, 51, and 52. Thus, voltage drop in direct current is prevented and a large degree of amplification can be provided.

First band-pass filter 29 has an input impedance of 200 Ω. Thus, in order to minimize loss, it is important to match the impedance of first matching circuit 28 and first mixer 26 at entrance 61 of first band-pass filter 26 with the input impedance of first band-pass filter 29. It is also important to make balanced line 46 shorter than balanced line 45 because the output part of first mixer 26 has an open-collector structure and balanced line 46 has a higher impedance than balanced line 45.

Figure 3:
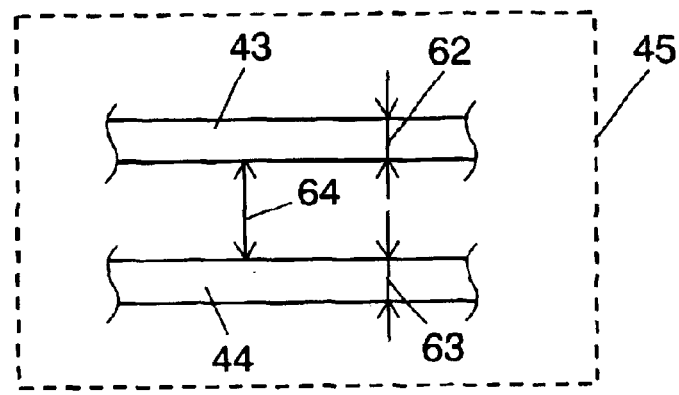
FIG. 3 is a plan view of balanced lines in the electronic tuner in accordance with the exemplary embodiment of the present invention.
Figure 4:
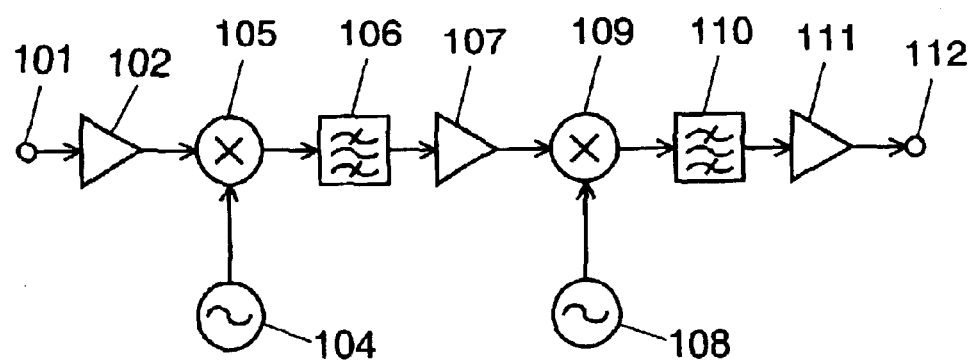
FIG. 4 is a block diagram of a conventional electronic tuner.

FIG. 3 is a plan view of balanced line 45. In balanced line 45, pattern width 62 of inner line 43 and pattern width 63 of outer line 44 are both set to 0.2 mm. Distance 64 between inner line 43 and outer line 44 is set to 0.3 mm, which minimizes the influence of line capacity. This structure applies to line 46.

As described above, in accordance with the present invention, the first active electric circuit, the matching circuit, the band-pass filter, and the second active electric circuit are made of balanced circuits and connected by a balanced line. The first active electric circuit has a high output impedance. Further, for the matching circuit, the impedance of the matching circuit on the band-pass filter side is equal to the impedance of the band-pass filter on the matching circuit side. Since the first active electric circuit has a high output impedance, only a small current flows. Thus, a HF signal transmission apparatus having low power consumption can be realized.

Shown in the exemplary embodiment of the present invention is a HF signal transmission apparatus in which each of the input and output impedances of the band-pass filter is an integral multiple of the impedance of the input terminal. Setting impedances of integral multiples in this manner simplifies the structure of impedance conversion elements, thus allowing cost reduction.

Also shown in the exemplary embodiment of the present invention is a HF signal transmission apparatus in which the matching circuit is made of inductance elements. Forming a matching circuit using inductor elements in this manner can prevent voltage drop in direct current, thus providing a large degree of amplification at a low power voltage.

Also shown in the exemplary embodiment of the present invention is a HF signal transmission apparatus in which the inductance elements are formed as a pattern. The pattern can be formed by etching technology in the production of the printed circuit board; thus, a thinner component can be produced at a lower cost.

Also shown in the exemplary embodiment of the present invention is a HF signal transmission apparatus in which the inductance elements are formed by reflow-soldered chip components. Because the chip components are reflow-soldered, the self-alignment effect allows the chip components to be fixed into predetermined positions. Thus, the inductance value of the pattern will not be changed before and after the reflow soldering. As a result, production errors are reduced; thus, stable performance can be obtained.

Also shown in the exemplary embodiment of the present invention is a HF signal transmission apparatus in which the first and second active electric circuits are integrated into a single square package and the first active electric circuit is disposed in the vicinity of one side of the package and the second active electric circuit is disposed in the vicinity of another side adjacent to the side. Being produced as an integrated circuit, the circuits have stable performance and production process thereof can be simplified. Down sizing can also be accomplished. Further, because the first and second active electric circuits are disposed on adjacent sides, wiring to the band-pass filter is easy.

Also shown in the exemplary embodiment of the present invention is a HF signal transmission apparatus in which the impedance of the balanced line between the first active electric circuit and the matching circuit is compensated by the matching circuit and the impedance of the balanced line between the band-pass filter and the second active electric circuit is compensated by making the inner pattern of the balanced line longer. The first and second active electric circuits are provided in the vicinity of the sides adjacent to each other. Thus, in the balanced lines connecting these circuits, the outer line is longer. To the portion before the band-pass filter, compensation is made by using the constants of the elements in the matching circuit. Therefore, no additional components are required for compensation. To the portion after the band-pass filter, compensation is made by using the length of the pattern. The desired length can be obtained by etching technology in the production of the printed circuit board. Therefore, no additional components are required for compensation also in this portion.

In the embodiment, it is also shown that compensation for the longer outer line is made to the portion after the band-pass filter of the above balanced line by using the thickness of the pattern. The desired thickness can be obtained by etching technology in the production of the printed circuit board. Therefore, no additional components for compensation are required also in this method. The thicker pattern reduces the DC resistance and thus loss.

Also shown in the exemplary embodiment of the present invention is a HF signal transmission apparatus in which the balanced line between the first active electric circuit and the band-pass filter is shorter than the balanced line between the band-pass filter and the second active electric circuit. The balanced line that is connected to the open collectors of the mixer and has a higher impedances is shorter than the other is. Thus, a mixer less likely to be influenced by noise and having excellent distortion characteristics can be realized.

Also shown in the exemplary embodiment of the present invention is a HF signal transmission apparatus in which the balanced lines between the matching circuit and the band-pass filter have an equal length. The balanced lines having an equal length can further balance the circuit.

Also shown in the exemplary embodiment of the present invention is a HF signal transmission apparatus in which the distance between the lines of the balanced lines is set to at least 0.3 mm. Providing such a distance can eliminate adverse effects of line capacity.

In the electronic tuner of the exemplary embodiment of the present invention, the mixer has an output impedance higher than that of a mixer of a conventional electronic tuner, i.e. 50 Ω. Thus, a smaller current flows through the electronic tuner of the present invention. An electronic tuner having low power consumption can be realized.

In the electronic tuner of the exemplary embodiment of the present invention, balanced circuits are used. The use of the balanced circuits allows a single active element to handle signals having large amplitudes, thereby simplifying the structure of the amplifiers. This also contributes to further reduction in power consumption of the electronic tuner. The use of the balanced circuits also allows elimination of the influence of externally supplied noise.

In the electronic tuner of the double superheterodyne type shown in the exemplary embodiment of the present invention, at least the first mixer, the first matching circuit, the first band-pass filter, and the first IF amplifier are made of balanced circuits and connected by a balanced line. The first mixer has a high output impedance. Further, for the first matching circuit, the impedance of the first matching circuit on the first band-pass filter side is equal to the impedance of the first band-pass filter on the first matching circuit side. Since the first mixer has a high output impedance, only a small current flows through the electronic tuner. Thus, an electronic tuner having low power consumption can be realized.

In the electronic tuner, balanced circuits are used. The use of balanced circuits allows a single active element to handle signals having large amplitudes, thereby eliminating the need of using a plurality of amplifiers. This also contributes to further reduction in power consumption of the electronic tuner. The use of the balanced circuits also allows elimination of the influence of externally supplied noise.

Because the electronic tuner of this embodiment is structured as a double superheterodyne type, it can improve interference eliminating capability.

Also shown in the exemplary embodiment of the present invention is an electronic tuner in which the output frequency of the signals supplied from the first band-pass filter is at least twice as high as the highest frequency of HF signals to be received. Thus, an electronic tuner having large interference eliminating capability can be realized.

Also shown in the exemplary embodiment of the present invention is an electronic tuner in which the pass bandwidth of the first band-pass filter is substantially five times as large as the bandwidth of one of television broadcast channels of HF signals. This structure can eliminate bad effects caused by variations in the ambient temperature and the center frequency of the first band-pass filter.

What is claimed is:

1. A high-frequency (HF) signal transmission apparatus comprising:

an input terminal;

a first active electric circuit receiving a signal fed into said input terminal;

a matching circuit connected to an output of said first active electric circuit;

a band-pass filter connected to an output of said matching circuit;

a second active electric circuit connected to an output of said band-pass filter; and an output terminal receiving output of said second active electric circuit;

wherein said first active electric circuit, said matching circuit, said band-pass filter, and said second active electric circuit are composed of balanced circuits and connected by a balanced line;

wherein said first active electric circuit has a high output impedance; and wherein, for said matching circuit, an impedance of said matching circuit on a side of said band-pass filter is equal to an impedance of said band-pass filter on a side of said matching circuit.

2. The HF signal transmission apparatus of claim 1, wherein each of an input impedance and an output impedance of said band-pass filter is an integral multiple of an impedance of said input terminal.

3. The HF signal transmission apparatus of claim 2, wherein said matching circuit is composed of an inductance element.

4. The HF signal transmission apparatus of claim 3, wherein the inductance element is formed of a pattern.

5. The HF signal transmission apparatus of claim 3, wherein the inductance element is a chip component and the chip component is reflow-soldered.

6. The HF signal transmission apparatus of claim 1, wherein said first active electric circuits and said second active electric circuits are integrated into a single square package, and said first active electric circuit is disposed in a vicinity of a first side of the package and said second active electric circuit is disposed in a vicinity of a second side adjacent to the first side.

7. The HF signal transmission apparatus of claim 6, wherein said matching circuit compensates impedance of the balanced line between said first active electric circuit and said matching circuit; and wherein the balanced line is composed of at least an inner pattern and an outer pattern, and impedance of the balanced line is corrected by making the inner pattern longer.

8. The HF signal transmission apparatus of claim 6, wherein said matching circuit compensates impedance of the balanced line between said first active electric circuit and said matching circuit; and wherein the balanced line is composed of at least an inner pattern and an outer pattern, and impedance of the balanced line is compensated by making a width of the outer pattern thicker than a width of the inner pattern.

9. The HF signal transmission apparatus of claim 6, wherein a length of the balanced line between said first active electric circuit and said band-pass filter is smaller than a length of the balanced line between said band-pass filter and said second active electric circuit.

10. The HF signal transmission apparatus of claim 6, wherein the balanced line between said matching circuit and said band-pass filter is made of at least two lines and the lines have an equal length.

11. The HF signal transmission apparatus of claim 6, wherein the balanced line is made of at least two lines and a distance between the lines is at least 0.3 mm.

12. An electronic tuner comprising:

an input terminal receiving a high-frequency (HF) signal;

a local oscillator;

a mixer receiving the HF signal fed into said input terminal and output of said local oscillator;

a matching circuit connected to an output of said mixer;

a band-pass filter connected to an output of said matching circuit;

an intermediate-frequency (IF) amplifier connected to an output of said band-pass filter; and an output terminal receiving output of said IF amplifier;

wherein at least said mixer, said matching circuit, said band-pass filter, and said IF amplifier are composed of balanced circuits and connected by a balanced line;

wherein said mixer has a high output impedance; and wherein, for said matching circuit, an impedance of said matching circuit on a side of said band-pass filter is equal to an impedance of said band-pass filter on a side of said matching circuit.

13. An electronic tuner comprising:

an input terminal receiving a high-frequency (HF) signal;

a first local oscillator;

a first mixer receiving the HF signal fed into said input terminal and output of said first local oscillator;

a first matching circuit connected to an output of said first mixer;

a first band-pass filter connected to an output of said first matching circuit;

a first intermediate-frequency (IF) amplifier connected to an output of said first band-pass filter;

a second local oscillator;

a second mixer connected to an output of said first IF amplifier and an output of said second local oscillator;

a second matching circuit connected to an output of said second mixer;

a second band-pass filter connected to an output of said second matching circuit;

a second intermediate-frequency (IF) amplifier connected to an output of said second band-pass filter; and an output terminal connected to an output of said second IF amplifier;

wherein at least said first mixer, said first matching circuit, said first band-pass filter, and said first IF amplifier are composed of balanced circuits and connected by a balanced line;

wherein said first mixer has a high output impedance; and wherein, for said first matching circuit, an impedance of said first matching circuit on a side of said first band-pass filter is equal to an impedance of said first band-pass filter at a side of said first matching circuit.

14. The electronic tuner of claim 13, wherein a pass frequency of said first band-pass filter is at least twice as high as a highest frequency in a frequency range of the HF signal to be received by said input terminal.

15. The electronic tuner of claim 14, wherein a pass bandwidth of said first band-pass filter is substantially five times as large as a frequency bandwidth of each channel of the HF signal to be received.

\* \* \* \* \*